United States Patent [19]
Thies et al.

[11] Patent Number: 6,118,830
[45] Date of Patent: Sep. 12, 2000

[54] DIGITAL DC RESTORATION DEVICE

[75] Inventors: William Thies, Saint Aubin sur Mer; Pieter Vorenkamp, Ifs, both of France

[73] Assignee: U.S. Philips Corporation, New York, N.Y.

[21] Appl. No.: 09/060,088

[22] Filed: Apr. 14, 1998

[30] Foreign Application Priority Data

Apr. 15, 1997 [FR] France ................................ 97 04597

[51] Int. Cl.⁷ .......................... H01L 25/06; H01L 25/10
[52] U.S. Cl. .......................................................... 375/319
[58] Field of Search .................................. 375/319, 317, 375/287, 345; 359/195

[56] References Cited

U.S. PATENT DOCUMENTS

| | | | |
|---|---|---|---|
| 4,257,126 | 3/1981 | Theall, Jr. ................................ | 359/195 |
| 4,847,865 | 7/1989 | Larson .................................... | 375/319 |
| 4,873,702 | 10/1989 | Chiu ....................................... | 375/319 |
| 5,146,476 | 9/1992 | Whitehead et al. .................... | 375/345 |
| 5,539,779 | 7/1996 | Nagahori ................................ | 375/317 |
| 5,796,781 | 8/1998 | DeAndrea et al. .................... | 375/288 |
| 5,857,003 | 1/1999 | Geiger et al. .......................... | 375/319 |

FOREIGN PATENT DOCUMENTS

| | | |
|---|---|---|
| 0 280 123 A1 | 8/1988 | European Pat. Off. . |
| 0 714 169 A1 | 5/1996 | European Pat. Off. . |

*Primary Examiner*—Stephen Chin
*Assistant Examiner*—Thomas E McKiernan
*Attorney, Agent, or Firm*—Steven R. Biren

[57] ABSTRACT

This device includes a main signal path in which a capacitor is included upstream of an analog/digital converter in which a conversion is triggered by a clock. According to the invention, the output of the analog/digital converter is connected to inputs of several threshold detectors which have positive detection thresholds in a progression proportional to consecutive powers of two, and several other threshold detectors which have negative detection thresholds which also progress proportionally to consecutive powers of two, which threshold detectors control current generators whose currents are added together into the capacitor.

9 Claims, 1 Drawing Sheet

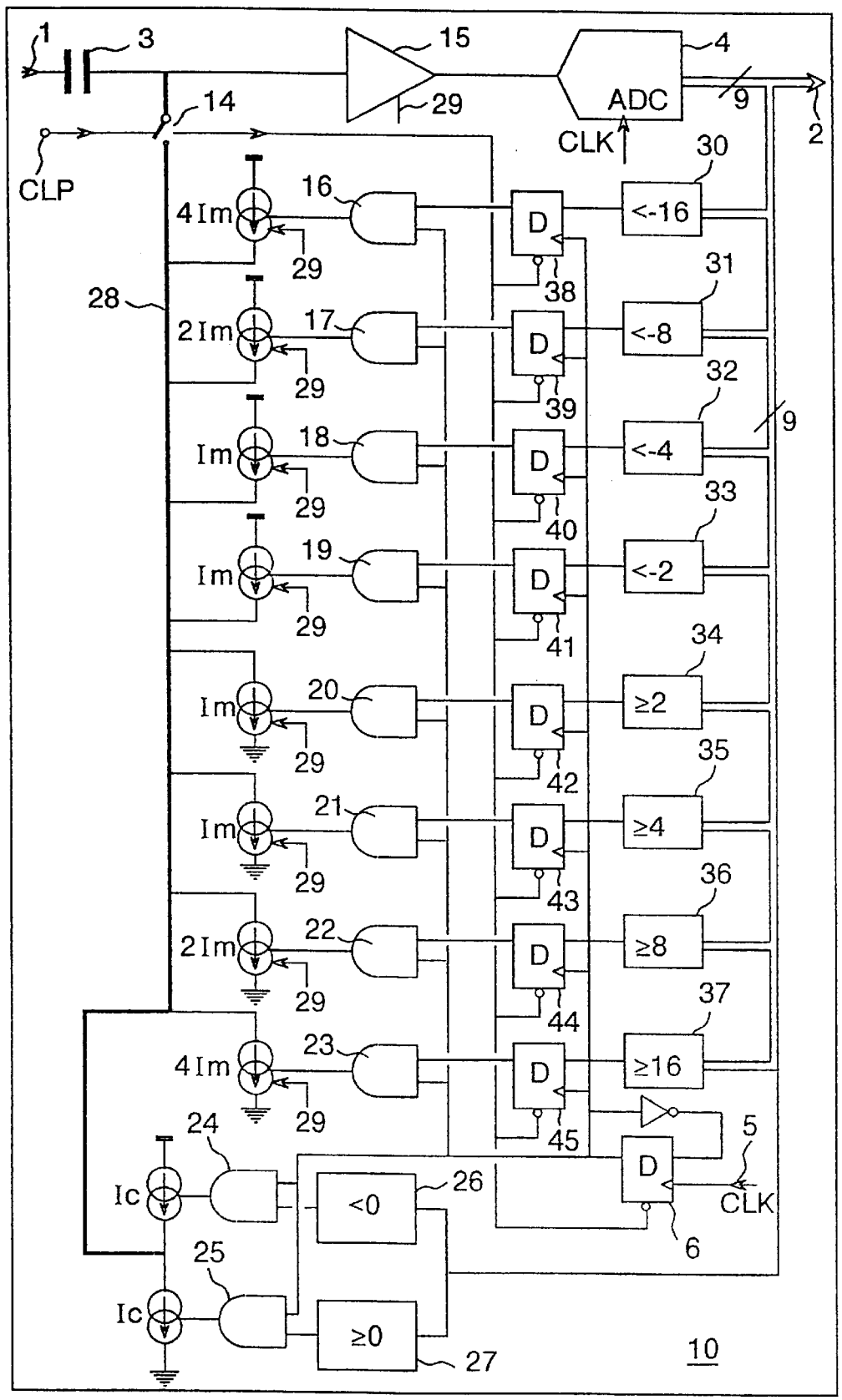

DIGITAL DC RESTORATION DEVICE

BACKGROUND OF THE INVENTION

The invention relates to an integrated circuit comprising inter alia a DC restoration device which has a main signal path in which a capacitor is included upstream of an analog/digital converter in which a conversion is triggered by a clock, comprising threshold detectors each provided with an input and an output and means for supplying at the output a logic signal if the input voltage exceeds a given threshold value which is different for each threshold detector, and comprising at least two current generators each provided with a control input and with a current output and with means for supplying upon command a calibrated current which is to be fed into the capacitor, the output of the analog/digital converter being connected jointly to the inputs of all threshold detectors.

The invention relates in particular to video pretreatment systems.

A DC restoration system as described in the opening paragraph is known from the document EP 0 714 169.

SUMMARY OF THE INVENTION

It is an object of the invention to provide a DC restoration device which has a fast operation and which can be used over wide signal amplitude and clock frequency ranges.

To achieve this object, several threshold detectors have a positive detection threshold such that the threshold voltage levels from one detector to the next show a progression proportional to successive powers of two, and several other threshold detectors have a negative detection threshold such that the absolute threshold voltage values also show a progression proportional to successive powers of two, while a current generator corresponds to each threshold detector, the outputs of all the current generators being connected such that their currents are added together.

A better convergence of the process of zero adjustment is obtained thereby.

The output of each threshold detector is connected to the signal input of a first flipflop D whose output is connected to a first input of a gate ET whose output is connected to the control input of one of the current generators, and the clock connection is connected to the input of a divider-by-two whose output is connected to the clock input of each of the first flipflops D as well as to a second input of each of the gates ET.

This renders it possible to carry out alternately a measurement, i.e. a conversion in the analog/digital converter and a registration of a result of a comparison of a comparator in the corresponding flipflop D. The circuit thus alternately measures and corrects, which is preferable to a measurement and a correction taking place simultaneously, during which the error correction current through an input impedance of 75 Ω would produce a major error in the voltage to be measured by the converter.

Advantageously, a switch controlled by a control signal is included between the current generators and the capacitor, and the control signal for the switch is also connected to the zero reset inputs of the first flipflops D.

This renders it possible to choose the moments when the correction is carried out.

The current generators corresponding to the consecutive detectors having the highest absolute threshold values advantageously supply progressive calibrated currents which are proportional to successive powers of two.

An exponential convergence of the adjustment process is thus obtained.

Advantageously, the device in addition comprises two supplementary gates of the ET type whose outputs are connected to respective control inputs of two supplementary current generators whose outputs are connected so as to add their currents to those of the other current generators, and two sign detectors each provided with an input and with an output and with means for delivering a logic signal at the output in dependence on the sign of the input voltage, the output of each of the sign detectors being connected to the input of one of the supplementary ET gates, while the inputs of the two sign detectors are jointly connected to the output of the analog/digital converter, and the calibrated current delivered by the supplementary current generators is at least several tens of times lower in value than that delivered by the other current generators.

The performance is thus improved by the combination of a fine tuning and a coarse tuning.

In a particular embodiment, the analog/digital converter is of a folding type.

A zero-crossing information is thus directly available at the output of the analog/digital converter.

Preferably, the main path comprises an amplifier with controllable gain placed between the capacitor and the analog/digital converter, and advantageously means are then provided for adjusting the calibrated current delivered by the current generators in dependence on the gain of the amplifier.

These and more detailed aspects of the invention will be elucidated in the ensuing description of an embodiment, which is given as an example to which, however, the invention is by no means limited.

BRIEF DESCRIPTION OF THE DRAWING

The sole FIGURE is a diagram of an integrated circuit comprising a line-up device.

DESCRIPTION OF THE PREFERRED EMBODIMENTS

The integrated circuit 10 shown in FIG. 1 comprises a DC restoration device which comprises between an input 1 and an output 2 a main signal path in which a capacitor 3 is included upstream of an analog/digital converter 4, in which a conversion is triggered by a clock CLK. The cycle of this clock is much shorter than the duration of a clamp period of the signal; it may have a frequency chosen between 12 and 16 MHz, or between 16 and 40 MHz for use in a television set or in a computer monitor. The analog/digital converter here delivers a converted value of 9 bits, for example, corresponding to the values ranging from zero to 511, at the output 2 which has nine conductors. The analog/digital converter is of a folding type: it supplies on specific conductors the sign of the value as well as a signal for the thresholds lower than −2, −4, −8, −16. The presence of these specific conductors renders it possible to use the circuit for a clamp on zero code, which would not be possible with another type of converter.

The digital inputs of all eight threshold detectors 30 to 37 are jointly connected to the digital output of the analog/digital converter. Four of these threshold detectors (30 to 33) deliver a logic signal at the output if the relevant digital input voltage becomes lower than a given threshold value which is different for each threshold detector, these values here being −16, −8, −4, and −2, respectively, i.e. in a progression proportional to successive powers of two. Four other threshold detectors (34 to 37) deliver a logic signal at the output if their digital input voltage becomes higher than or equal to respective threshold values of +2, +4, +8, and +16. In addition, these thresholds relate to programmable code values 0, 32, 128, and 256: the indicated threshold values are therefore relative, measured in relation to the programmed value. For example, a threshold of −2 in relation to the programmed value 32 will thus correspond to the value 30.

The output of each threshold detector 30–37 is connected to a respective signal input of a type D flipflop 38–45 whose output is connected to a respective first input of a type ET gate 16–23 whose output is connected to the control input of a corresponding current generator.

The clock connection 5 (CLK) is connected to the input of a divider-by-two formed by a type D flipflop 6 which is looped back onto itself with inversion and whose output is connected both to the clock input of each of the first flipflops 38 to 45 and to a second input of each of the gates 16 to 23 so as to realize alternately on the one hand a conversion in the analog/digital converter and on the other hand a registration of the result of the comparison in each flipflop D.

A current generator provided with a control input and a current output and with means for providing a calibrated current upon command corresponds to each threshold detector 30–37. The outputs of all the current generators are connected such that their currents are added together in a connection line 28 so as to be fed into the capacitor 3 via a switch 14. The calibrated currents of the current generators which are controlled by the gates 16 to 19 have values of 4Im, 2Im, Im, and Im, respectively, and are obtained from a positive supply and fed to the connection line 28. Similarly, the currents of the current generators controlled by the gates 20 to 23 have respective values of Im, Im, 2Im, and 4Im, but these are drawn from the connection line 28 towards ground.

The switch 14 is controlled by a control signal CLP which is connected to the zero reset input of each of the first flipflops 38 to 45. The signal CLP is active during the period in which the input signal 1 corresponds to a calibration level (black level in TV).

The two current generators corresponding to the detectors 33 and 32 (or 34 and 35) which have the lowest absolute threshold values deliver calibrated currents Im of the same value, and the calibrated current values 2Im, and 4Im supplied by the current generators corresponding to the further detectors 31 and 30 (or 36 and 37) show an increase proportional to successive powers of two.

Two supplementary gates 24 and 25 of the ET type control two supplementary current generators whose outputs are connected such that their currents Ic are added together with those of the other current generators in the connection line 28. Two sign detectors 26 and 27 are each provided with an input and with an output and with means for delivering a logic signal at the output in dependence on the sign of the input voltage, while the output of each of these sign detectors is connected to the input of one of the supplementary gates 24 and 25, of which the other input is connected to the output of the flipflop 6, as are the other gates. The inputs of the two sign detectors are jointly connected to the output of the analog/digital converter 4. When a so-called folding model is used for the analog/digital converter, one specialized conductor which indicates the sign of the signal will be available among the nine conductors forming the output 2 thereof. This conductor is connected to the input of the detectors 26, 27.

The calibrated current Ic supplied by the supplementary current generators is at least several tens of times lower in value than that delivered by the other current generators. An example for the values of the calibrated currents is of the order of one milliampere for Im and a few microamperes for Ic, in which example the source connected to the input 1 has an impedance of 75 Ω, and the capacitor 3 has a value of the order of a few tens of nanofarads.

A threshold of three may be chosen, for example, for the threshold detectors 33 and 34 which have the lowest threshold values, instead of the value two as indicated. Similarly, the current of the current generators Ic may be programmed within a range of values, for example between 3 and 5 $\mu$A. An optimum adjustment of these values renders it possible to avoid interferences between the operation of the weak current generators (Ic) on the one hand and that of the strong current generators (Im) on the other hand.

The output level may be adjusted, in addition to the zero adjustment, thanks to an amplifier 15 which is placed in the main path between the capacitor 3 and the analog/digital converter 4. This amplifier has a gain which is controllable by means of a control signal applied to a gain control input 29. Just as the value of the zero drift depends on the gain of the amplifier, the value of the currents Im of the current generators is adjusted as a function of the gain of the amplifier, for example by means of the control signal 29. Those skilled in the art know how to realize an amplifier with controllable gain, as well as a programmable current generator, without a detailed description being necessary here.

What is claimed is:

1. An integrated circuit comprising inter alia a DC restoration device which has a main signal path in which a capacitor is included upstream of an analog/digital converter in which a conversion is triggered by a clock, comprising threshold detectors each provided with an input and an output and means for supplying at the output a logic signal if the input voltage exceeds a given threshold value which is different for each threshold detector, and comprising at least two current generators each provided with a control input and with a current output and with means for supplying upon command a calibrated current which is to be fed into the capacitor, the output of the analog/digital converter being connected jointly to the inputs of all threshold detectors, characterized in that several threshold detectors have a positive detection threshold such that the threshold voltage levels from one detector to the next show a progression proportional to successive powers of two, and several other threshold detectors have a negative detection threshold such that the absolute threshold voltage values also show a progression proportional to successive powers of two, while a current generator corresponds to each threshold detector, the outputs of all the current generators being connected such that their currents are added together.

2. An integrated circuit as claimed in claim 1, characterized in that the output of each threshold detector is connected to the signal input of a first flipflop D whose output is connected to a first input of a gate ET whose output is connected to the control input of one of the current generators, and the clock connection is connected to the input of a divider-by-two whose output is connected to the clock input of each of the first flipflops D as well as to a second input of each of the gates ET.

3. An integrated circuit as claimed in claim 2, characterized in that a switch controlled by a control signal is included between the current generators and the capacitor, and the control signal for the switch is also connected to the zero reset inputs of the first flipflops D.

4. An integrated circuit as claimed in claim 1, characterized in that the current generators corresponding to the consecutive detectors having the highest absolute threshold values supply progressive calibrated currents which are proportional to successive powers of two.

5. An integrated circuit as claimed in claim 1, characterized in that the device further comprises two supplementary gates of the ET type whose outputs are connected to respective control inputs of two supplementary current generators whose outputs are connected so as to add their currents to those of the other current generators, and two sign detectors each provided with an input and with an output and with means for delivering a logic signal at the output in dependence on the sign of the input voltage, the output of each of the sign detectors being connected to the input of one of the supplementary ET gates, while the inputs of the two sign detectors are jointly connected to the output of the analog/digital converter, and the calibrated current delivered by the supplementary current generators is at least several tens of times lower in value than that delivered by the other current generators.

6. An integrated circuit as claimed in claim 5, characterized in that the threshold values of the detectors having the lowest threshold are programmable.

7. An integrated circuit as claimed in claim 5, characterized in that the analog/digital converter is of a folding type.

8. An integrated circuit as claimed in claim 1, characterized in that the main path further comprises an amplifier with controllable gain placed between the capacitor and the analog/digital converter.

9. An integrated circuit as claimed in claim 8, characterized in that it comprises means for adjusting the calibrated current delivered by the current generators in dependence on the gain of the amplifier.

* * * * *